United States Patent [19]

Janisiewicz et al.

[11] 4,367,584
[45] Jan. 11, 1983

[54] METHOD AND APPARATUS FOR STRAIGHTENING LEADS AND VERIFYING THE ORIENTATION AND FUNCTIONALITY OF COMPONENTS

[75] Inventors: Stanley Janisiewicz, Endwell; Michael M. Levie; Andrew J. Czebiniak, both of Binghamton, all of N.Y.

[73] Assignee: Universal Instruments Corporation, Binghamton, N.Y.

[21] Appl. No.: 187,368

[22] Filed: Sep. 15, 1980

[51] Int. Cl.³ .......................... H05K 3/30; B23P 6/00; B21F 1/02
[52] U.S. Cl. .................................... 29/837; 29/564.1; 29/741; 140/147; 324/158 R; 324/158 F
[58] Field of Search ................. 29/832, 834, 835, 741, 29/739, 592 R, 593, 407, 837, 838, 564, 564.1; 140/147; 209/573; 198/608; 324/158 R, 158 F; 339/74 R

[56] References Cited

U.S. PATENT DOCUMENTS

| | | | |
|---|---|---|---|
| 3,276,579 | 10/1966 | Dluzen et al. | 209/573 X |
| 3,550,238 | 12/1970 | Allen et al. | 29/741 X |
| 3,848,221 | 11/1974 | Lee, Jr. | 339/74 R |
| 4,030,180 | 6/1977 | Pierson | 29/741 |
| 4,047,780 | 9/1977 | Cedrone | 324/158 F X |
| 4,063,347 | 12/1977 | Woodman, Jr. | 29/741 X |
| 4,068,170 | 1/1978 | Chayka et al. | 324/158 F X |
| 4,128,174 | 12/1978 | Frisbie et al. | 198/608 X |
| 4,234,418 | 11/1980 | Boissicat | 29/741 X |
| 4,293,998 | 10/1981 | Kawa et al. | 29/741 X |

OTHER PUBLICATIONS

Western Electric Tech. Digest No. 35, pp. 19-20 Jul. 1974, by R. Filek et al.
IBM Tech. Disclosure Bulletin vol. 17, No. 11, Apr. 1975, pp. 3205-3206 by L. G. Call et al.

Primary Examiner—Francis S. Husar
Assistant Examiner—Carl J. Arbes
Attorney, Agent, or Firm—Fidelman, Wolffe & Waldron

[57] ABSTRACT

A method and apparatus are provided to form leads of components prior to insertion into a printed circuit board while, at the same time, straightening bent leads and testing the electronic functioning of each component through the use of a controller which electronically simulates the operating mode of the component. The orientation of the component is also tested.

18 Claims, 12 Drawing Figures

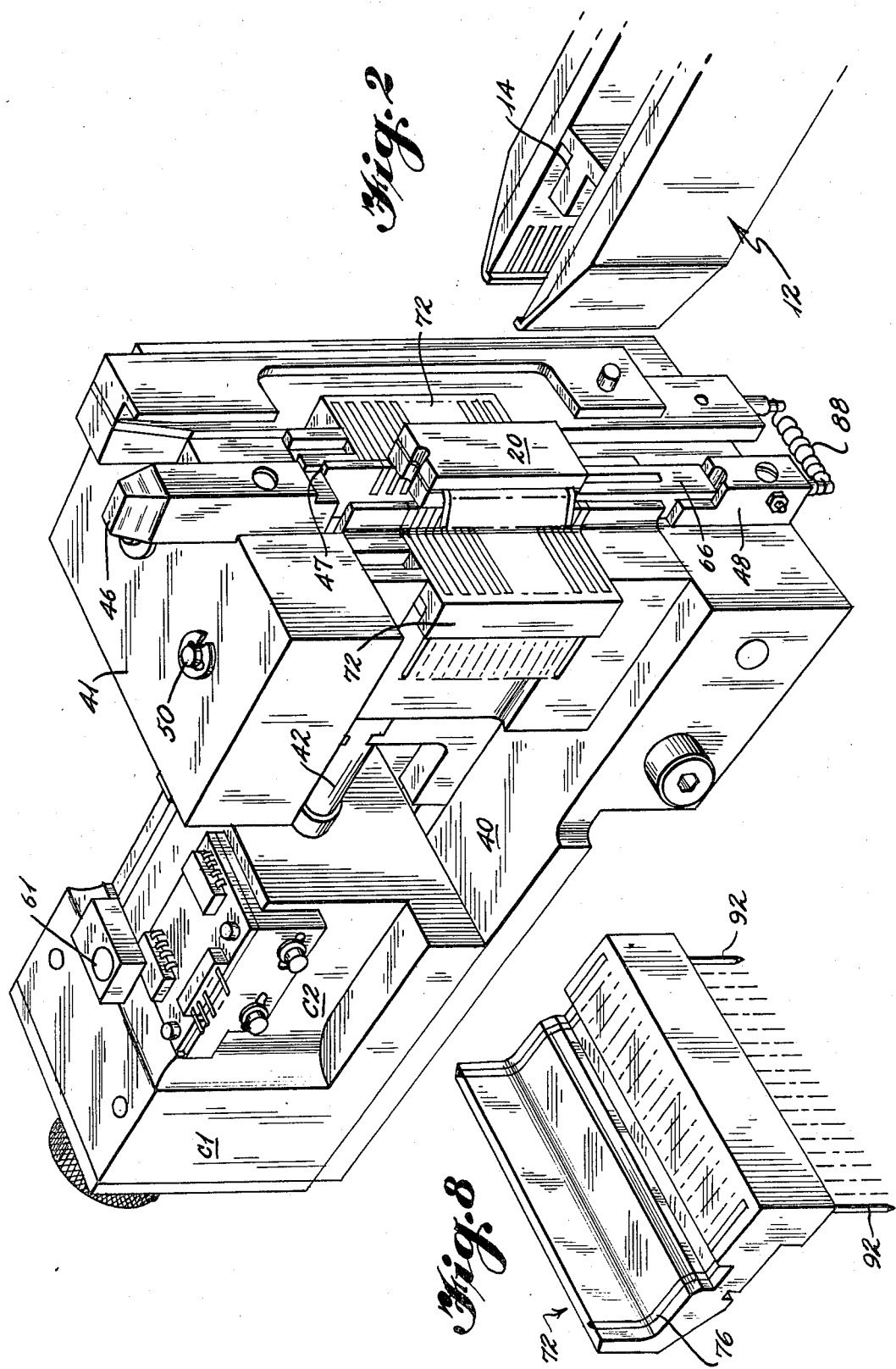

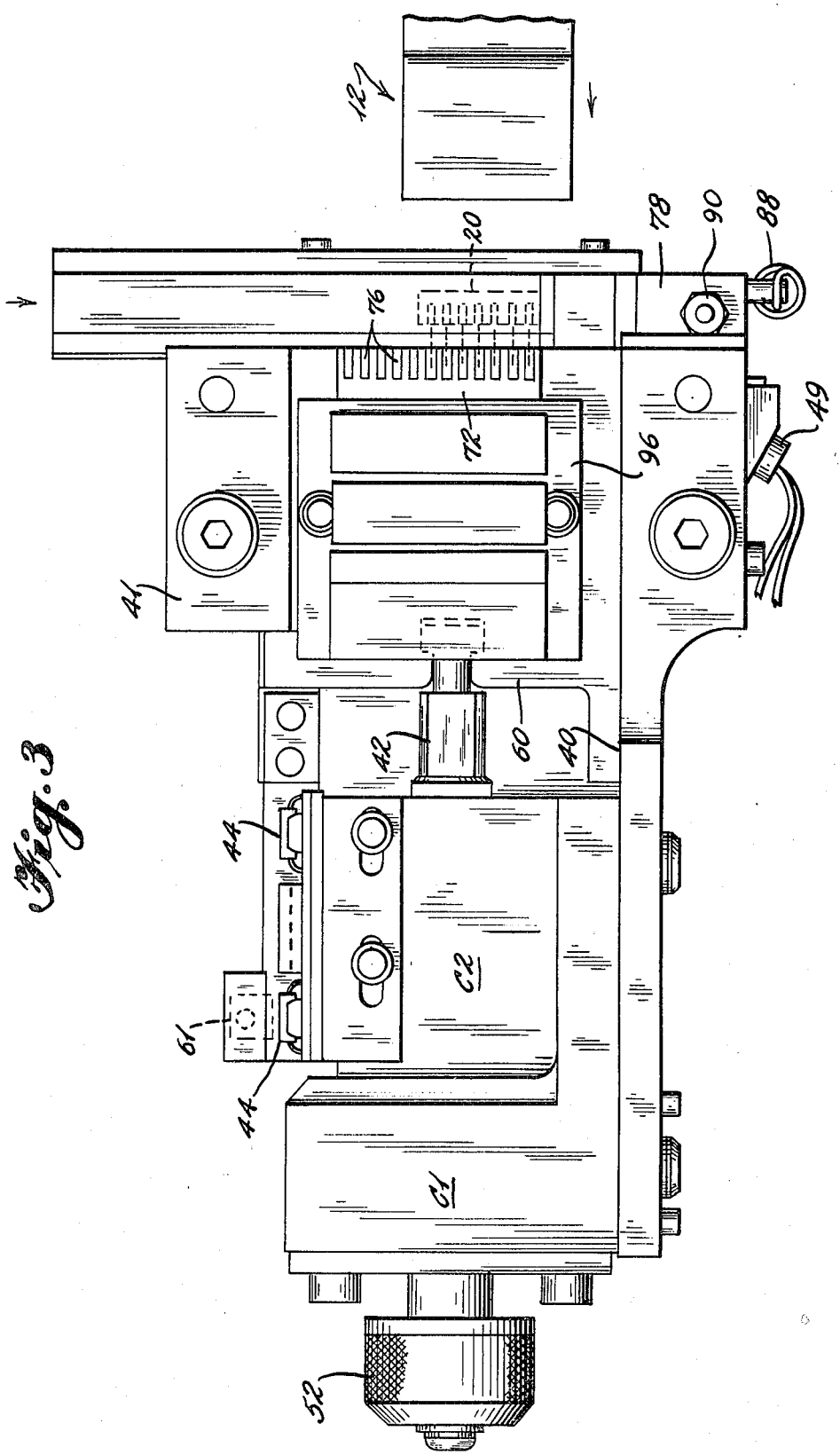

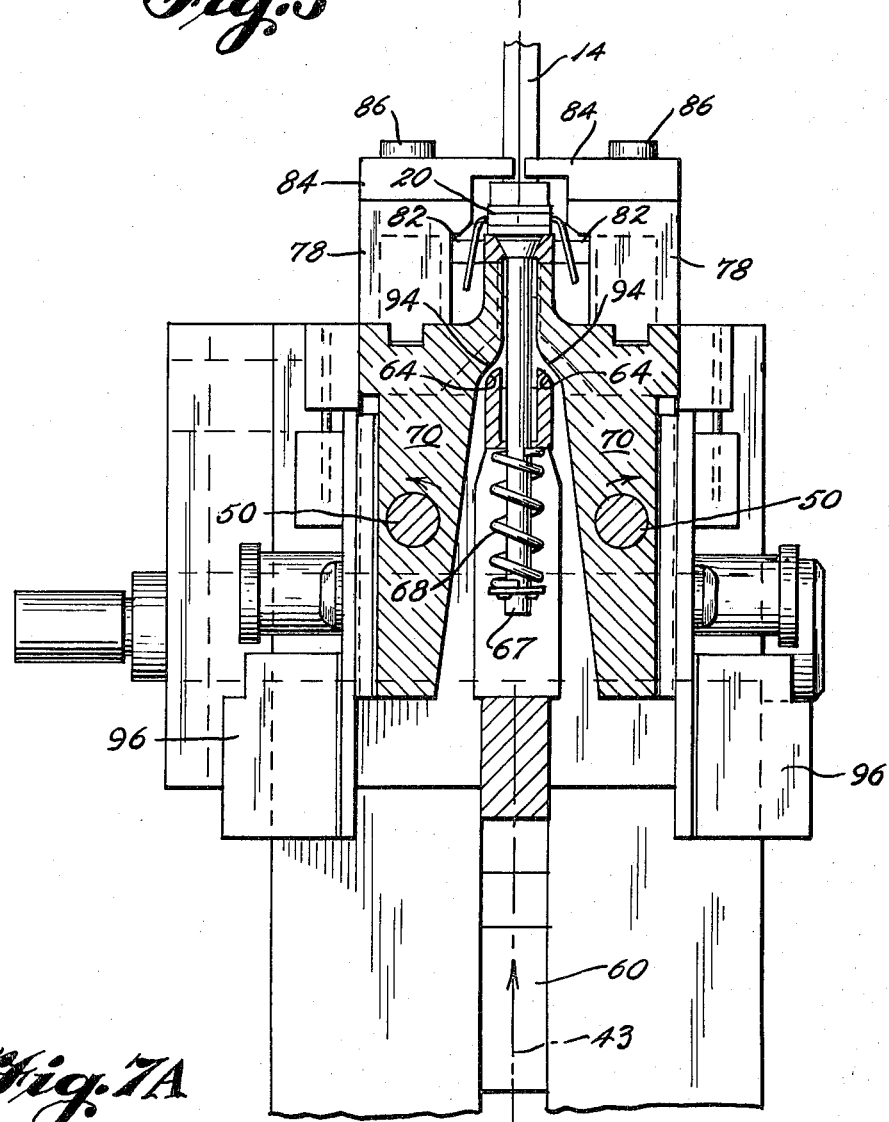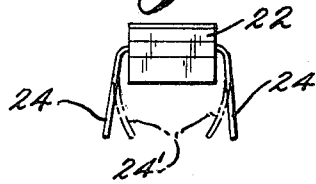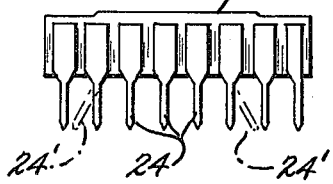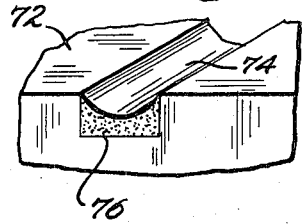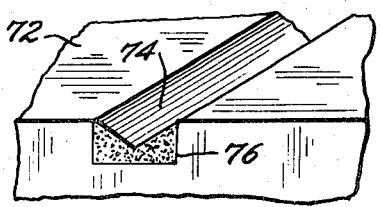

METHOD AND APPARATUS FOR STRAIGHTENING LEADS AND VERIFYING THE ORIENTATION AND FUNCTIONALITY OF COMPONENTS

This invention relates to a method and apparatus for verifying the orientation and functionality of parts, prior to another operation.

This method and apparatus are particularly applicable for verifying the orientation and functionality of electrical components having a body portion with dual, in-line, parallel leads or terminals extending therefrom. Electrical components commonly referred to as DIP's are typically of this construction and, as will be apparent from the description which follows, the method and apparatus of the invention are particularly applicable for verifying the orientation and functionality and for forming and straightening the leads of these as well as similarly constructed types of components.

Previously, an attempt has been made to test components while they are in the insertion head. The prior apparatus includes an insert head in which a test is made for the proper component (e.g., the proper DIP) and for the proper orientation of the component (e.g., proper orientation of the body to the X-Y axes of the printed circuit board on which they are to be mounted). Assuming that a proper component is in the insertion head but that it is improperly oriented, the head must be rotated around its longitudinal axis prior to insertion. Also, this prior apparatus will test only for the proper type of component, not for the electronic functioning of a component when it is the proper type.

Several disadvantages of the prior art are readily apparent. The insert head has wires incorporated into it to perform these tests, and these wires are subject to stress abuse, and breakage due to the necessity for rotating the insert head to properly orient the component. This breakage is a serious source of machine "down time". Additionally, the sophistication of the component test leaves something to be desired namely, a test for the electronic functionality of the component rather than a mere test to determine that the component is the proper type to be inserted. Further, the tooling for this prior art insert head is quite expensive and replacement of the contact fingers is cumbersome. Still further, insertion of a component into the printed circuit (P.C.) board without checking the electronic functioning of the component increases the subsequent amount of "debugging" and rework of P.C. boards.

Accordingly, an object of this invention is to verify that dual, in-line, parallel-lead (DIP) components are functional prior to insertion into a printed circuit board.

Another object of this invention is to verify that DIP components are properly oriented prior to insertion into a P.C. board.

A further object of the invention is to form and to straighten bent leads of DIP components, or other parts having lead-like members protruding from a body, prior to another operation such as insertion into a P.C. board.

A still further object of the instant invention is to provide a method and apparatus for testing components, featuring: an inherent reduction in tooling expense, an elimination of undue stress on wiring, and a simplified replacement of test contacts; these features are combined for a reliable, less expensive, functional test of DIP components.

Other objects of the invention will, in part, be obvious and will, in part, appear hereinafter.

The above outlined objectives are accomplished by means of an apparatus which, according to the present invention, generally includes a lead-in rail for guiding the supplied components, with leads straddling this rail as they are gravity fed into position for testing and lead straightening. A sensor, such as a photodetector, senses that a component is in position for testing and tells a controller to proceed with the subsequent operations. A pair of blades having multiple indentations are pivotal so that the indentations receive the leads of the component in a wiping action during their pivotal motion—this affords lead straightening. Additionally, electrical contacts which contain these indentations afford electrical testing of the individual leads of the component during this wiping action. By connecting the electrical contacts to a controller such as a computer interface, various tests may be conducted to determine the functionality and orientation of the component.

This apparatus is adaptable to virtually any type of parts handling system which is capable of feeding the components to it in a consistent fashion. In the disclosed embodiment, the apparatus is illustrated in operative relation with a machine for selection, transfer, and insertion of DIP components into a P.C. board. However, it is apparent that it is easily adaptable to many other types of machines and systems.

The invention accordingly comprises the several steps and the relation of one or more of such steps with respect to each of the others and the apparatus embodying features of construction, combination of elements and arrangement of parts which are adapted to effect such steps, all as exemplified in the following detailed disclosure, and the scope of the invention will be indicated in the claims.

For a fuller understanding of the nature and objects of the invention, reference should be had to the following detailed description taken in connection with the accompanying drawings, in which:

FIG. 2 is an isometric view of the apparatus of the invention, partially broken-away.

FIG. 3 is a side view of the apparatus of FIG. 2.

FIG. 5 is a sectional view along the lines 5—5 of FIG. 4.

FIGS. 7A and 7B are views of a DIP component, with bent leads depicted in phantom-lines.

FIG. 8 is an isometric view of one of the pivotal blade assemblies.

FIGS. 9A and 9B disclose several possible indentation configurations for the electrical contacts of the blade assembly.

DETAILED DESCRIPTION OF ONE EMBODIMENT OF THE INVENTION

Figure 1:
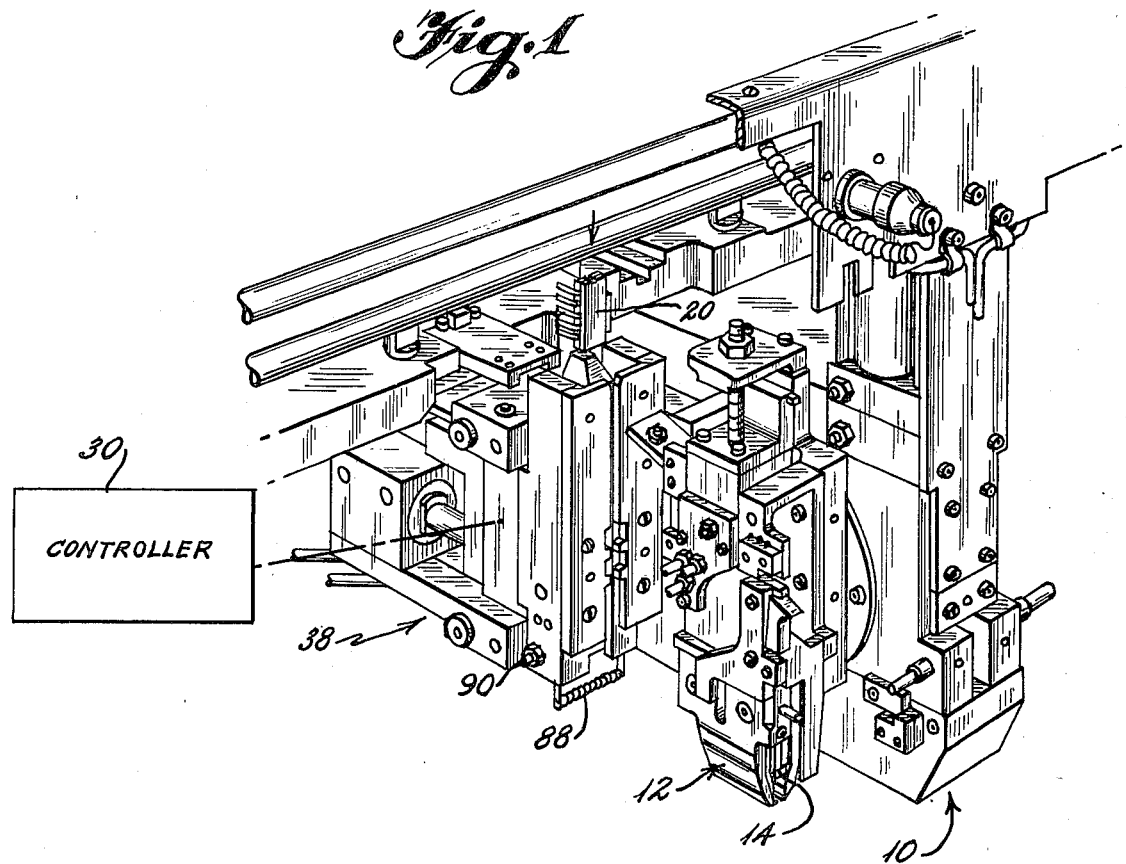
FIG. 1 is an isometric view of the inventive apparatus incorporated with a readily available insertion head assembly.

Referring to FIG. 1, a DIP verifier assembly 38 is shown mounted in cooperative relation with a readily available DIP insert head assembly 10 (such as that described in the MULTI-MODULE DIP TRANSFER AND INSERTION MACHINE patent application of Holmes and Janisiewicz, U.S. Ser. No. 078,682, filed Sept. 25, 1979, now U.S. Pat. No. 4,283,836, issued Aug. 18, 1981 and U.S. Pat. No. 4,030,180 to Pierson). Rotatable insert head 10 has DIP receiving fingers 12 and an insert plunger 14 that reciprocates between fingers 12 to push a captured component into a P.C. board, upon command. FIG. 1 discloses the insert head 10 in the vertical position for insertion of a component. The head 10 is pivotal to a horizontal position for receiving a component such that fingers 12 are in the operative relation to assembly 38 as shown in FIG. 2.

Referring to FIGS. 2-6, the inventive apparatus has guide grooves 53 in support housing 40 and upper guide 41 for reciprocable slide 60. A binary cylinder arrangement is designated C1, C2. Test stroke cylinder C1 provides a partial extension of piston rod 42 and attached slide 60 (nominally 0.312") along stroke axis 43, while transfer stroke cylinder C2 provides an additional extension (nominally 0.500") for transfer of DIP 20 into insert head fingers 12 after the test has been completed. A threaded knob arrangement 52 (best seen in FIG. 3) allows adjustment of the test stroke.

Slide 60 has an attached magnet 61 for actuating Hall Effect switches 44, mounted on transfer stroke cylinder C2, to notify controller 30 of the fully extended and retracted stroke positions.

A pair of pivotal support arms 70 (best seen in FIGS. 2, 5, 6A, and 6B) are attached to upper guide 41 and support housing 40 by pivot pins 50. Blade assemblies 72 are fitted onto the front of pivotal support arms 70 by a tongue and groove arrangement. FIG. 8 discloses one of the insulated molded plastic blade assemblies 72 with embedded contacts 76 extending to electrical connectors 92. Each blade 72 has an insulated lateral retainer 78 fitted to the front of it—again, by a tongue and groove arrangement. Mounted on each lateral retainer 78 is a front guide 84, with machine screws 86 removably attaching front guides 84, lateral retainers 78, and blade assemblies 72 to pivotal support arms 70. Lateral retainers 78 also have attached lead stops 82 (best seen in FIGS. 3-5), for a purpose yet to be explained.

Removably attached to the outside of each pivotal support arm 70 is an impedance matching network P.C. board 96 having one electrical connector for attachment to conductors 92 and another electrical connector for attachment to a wiring harness (not shown) which, in turn, is connected to the controller 30.

Figure 6A:
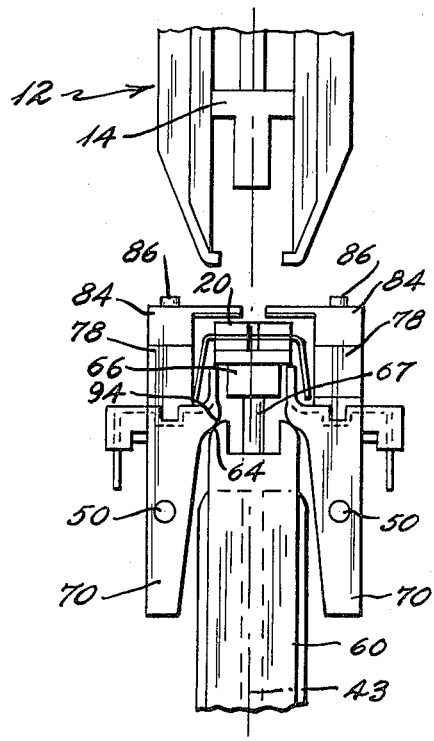
FIGS. 6A and 6B are schematic illustrations of the testing of a component.
Figure 6B:
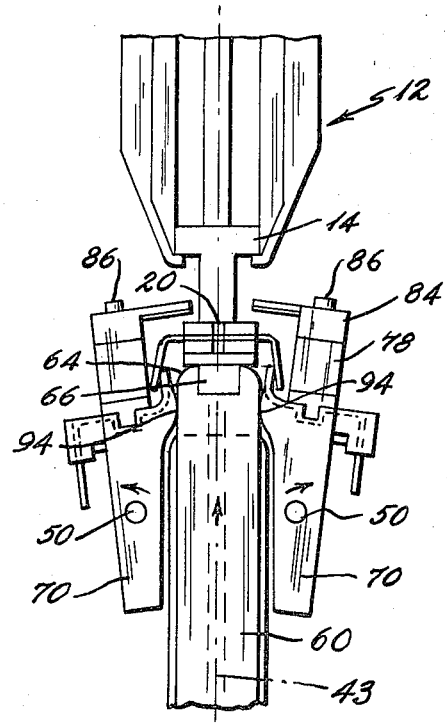
Figure 4:
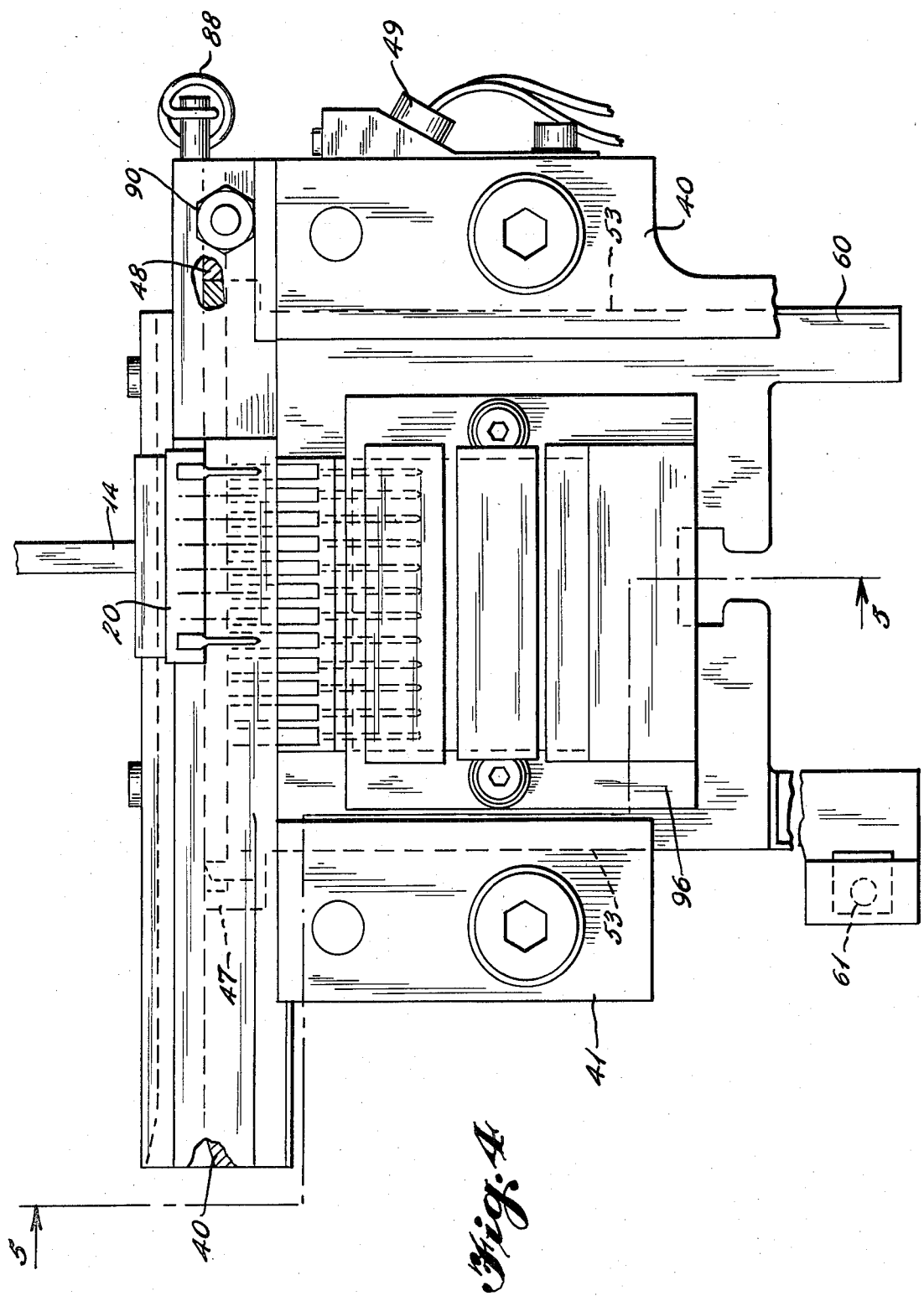
FIG. 4 is an enlarged view of a portion of the apparatus of FIG. 3.

Referring to FIGS. 5, 6A, and 6B, the front end of slide 60 has outer cam surfaces 64 engageable with inner cam surfaces 94 of support arms 70 to cause pivoting of arms 70 during extension of slide 60.

As best seen in FIG. 2, attached to upper guide 41 support housing 40 are, respectively, a tapered lead-in rail 46 (with a cut-out step to provide an upper platform stop 47) and a stepped lower platform stop 48. These upper and lower platform stops 47,48 are configured to receive the upper and lower ends of a slide connected platform 66 and adapted to limit the rearward movement of platform 66 during retraction of slide 60. Stops 47,48 are also arranged so that their front faces are in the same plane as the front face of platform 66 when it is in the retracted position, thus allowing a DIP 20 to freely feed from lead-in rail 46 to platform 66. To keep platform 66 against stops 47,48 when slide 60 is retracted, a platform connecting rod 67 is telescoped through the front end of slide 60 (as best seen in FIG. 5) with compression spring 68 urging platform 66 toward the rear (toward binary cylinder arrangement C1, C2) and into engagement with stops 47,48.

Spring 88 (FIG. 1), attached to the bottom of laterial retainers 78 biases inner cams 94 of support arms 70 into engagement with the front end of slide 60; and screws 90 are threaded through lateral retainers 78 so that engagement of screws 90 with lower platform stop 48 adjustably limits the return pivot of arms 70 after having been opened by the extension of slide 60.

In lieu of testing for the absence of a DIP 20 by the controller 30, a photodetector arrangement may be incorporated into the apparatus. For instance, a light transmitter such as that referred to as the PART-IN-POSITION SENSOR of FIG. 1 may be mounted appropriately (such as on insert head assembly 10) to provide light to a photodetector 49, illustrated in FIGS. 3 and 4. To accommodate the passage of light to photodetector 49, front guides 84 are cut away, platform 66 has a slot therein, and portions of slide 60 and housing 40 are beveled or slotted. In this manner, a DIP 20 in position for testing would block the light to photodector 49.

OPERATON

With the apparatus as shown in FIG. 1, a DIP 20 is released by a shuttle or the like so that it drops down and is guided by lead-in rail 46, while confined thereto by lateral retainers 78 and front guides 84, until the bottom two leads engage lead stops 82. Having been detected by the photodetector arrangement, and according to the controller program, insert head 10 is rotated to the horizontal position of FIG. 2. Insert plunger 14 then is extended into engagement with the top of DIP 20 to hold it against platform 66, and test stroke cylinder C1 is fired to partially extend slide 60. Outer cam surfaces 64 engage inner cam surfaces 94 to cause partial pivoting of support arms 70. Compression spring 68 continues to bias platform 66 against platform stops 47,48 while slide 60 moves forward on this test stroke. By pivoting arms 70, blades 72 are also pivoted so that the imbedded electrical test contacts 76 engage the leads of the DIP.

FIGS. 7A and 7B depict a typical DIP 20 having a body 22 and leads 24; phantom-lined leads 24' depict various ways in which leads 24 may be bent. FIGS. 9A and 9B disclosed enlarged contacts 76 with several effective cross-sectional depression shapes 74 (U and V-shaped cross sections). Outward wiping engagement of contacts 76 with leads 24 tends to form the leads for subsequent insertion and to straighten any bent leads 24; with the U or V-shaped depressions 74 providing a better electrical contact surface by virtue of providing two lines of contact along the length of a lead. Depressions 74 serve the lead straightening function, as well as the function of removing carbon from leads 24 during the wiping action.

The time length of wiping engagement of contacts 76 and leads 24 is just long enough for the controller test to be accomplished (nominally, less than 50 msec.). If the component tests "good", transfer stroke cylinder C2 is fired to fully extend slide 60, driving platform 66 and DIP 20 outward (while insert plunger 14 retracts) and between fingers 12 to load the insert head 10. If the component test "bad", it will be retested, as explained later.

When the leads 24 of a DIP 20 are engaged by contacts 76 during the test stroke of slide 60, the DIP 20 may be tested by the temporary connection of controller 30 to leads 24 via contacts 76, conductors 92, impedance matching network 96, and a wiring harness (not shown) between network 96 and controller 30.

Various logic combinations simulating operating modes of the DIP 20 are then supplied to leads 24 by controller 30. This makes possible the testing of counters, shift registers, and simple memories as well as combinatory logic. Devices having totem-pole, open collector, or tri-state outputs may be tested and distinguished between. SSI and MSI 0.300" wide DIPs of the 7400 series, 800 and 900 series DTL, as well as TTL and 4000 series CMOS digital logic varieties having as many as 24 leads, may be tested. The test approach provides one of the following for each lead: a power voltage; a logic control function; a dynamic logic signal (generated as one bit of an eight bit pseudorandom number); or the sensing of a resultant output level. Three output levels are sensed: 0, 1, and open. For each of approximately 128 clock cycles, the several outputs are summed and counted in groups, with the resultant 16 bit tally being fed to the controller 30 where it is compared with a "characteristic number" (stored number) for each DIP. Failure of the tally to match the "characteristic number" will cause the DIP to be retested for reverse orientation and, if the DIP passes this retest, a control panel COMPONENT REVERSED light (not shown) will be illuminated for notification to the monitoring operator of the machine.

In any event, component 20 is transferred to insert head fingers 12. If the first test was passed, insert head assembly 10, on command of the controller 30, inserts component 20 into the P.C. board. If the first test was failed and the retest was passed, a REJECT light will notify the operator and the component may be saved for later use. If both tests are failed, the REJECT light will notify the operator and the component 20 may be discarded by the operators or by automatic control of controller 30. The operator or controller 30 may select a "repair" function so that, after the remainder of the P.C. Board has been populated, the machine will automatically return to the site of no insertion (due to a failed test) and insert a good component.

The test description for various DIPs may be furnished with the controller 30. For any non-supplied type, it is merely necessary to define the function of the individual pins in the proper sequence on the basis of IC manual information, run a test and enter the characteristic number into the controller 30. Open collector and tri state types are inherently accommodated. For some of the more complex types, such as presettable up-down counters, some care is required in the proper selection of control function inputs to fully test the device; however any arrangement of pin definitions compatible with the device will produce a valid test. Additionally, the machine controller may be adapted to tally and report all errors on a type-by-type basis, as well as to test for the absence of a part.

The test description for each device may be stored in 16 bytes of memory with: 2 bytes allocated to the "characteristic number"; 2-3 bytes allocated to the generic number (i.e., 74193 chip); and the remaining bytes allocated to defining the leads of the device, where ½ byte will define 1 lead (i.e., a twenty-four lead device will require 12 bytes). Of course, memory may be augmented to handle as many different types of devices as desired.

Use of this test means improves the yield of functional PC boards by reducing the "debugging" and reworking of the boards due to insertion of faulty components.

What is claimed is:

1. An apparatus for testing components of the type having a body and dual, in-line, parallel leads projecting from said body, said apparatus comprising:
   circuit means for determining defective components;
   contact means for connecting said leads to said circuit means for said testing and having plural electrical contacts engageable with respective ones of said leads; and
   lead straightening means for forming said leads for insertion and for straightening bent leads during said testing.

2. An apparatus as in claim 1, wherein said apparatus further comprises:
   pivot means for pivoting said contact means into engagement with said leads.

3. An apparatus as in claim 1, wherein said contact means is adapted for wiping engagement with said leads during said testing.

4. An apparatus as in claim 1, wherein said lead straightening means comprises plural depressions engageable with said leads during straightening.

5. An apparatus as in claim 1, wherein said lead straightening means comprises plural depressions adapted to receive said leads in wiping engagement during straightening.

6. An apparatus as in claim 4, wherein said contact means further comprises said depressions.

7. An apparatus as in claim 1, wherein said apparatus further comprises support means for removably supporting said contact means and said lead straightening means for pivotal wiping engagement with said leads, upon command.

8. An apparatus as in claim 4, wherein said depressions are V-shaped in cross-section.

9. An apparatus as in claim 4, wherein said depressions are U-shaped in cross-section.

10. In an apparatus adapted for supply, transfer to, and insertion into printed circuit boards of electronic components having a body and dual, in-line, parallel leads projecting from said body, said apparatus having supply, transfer, and insertion assemblies, the improvement comprising:
    intermediate guide and transfer means for guiding said components from said transfer assembly to a test position and transferring said component from said test position to said insertion assembly after testing;
    circuit means for testing of said components;
    contact means, provided in said transfer assembly, for electrical connection of said leads to said circuit means for said testing; and
    lead straightening means for straightening bent leads of said components.

11. An apparatus as in claim 10, wherein said contact means comprises:
    plural spaced electrical contacts wipingly engageable with respective ones of said leads during said testing.

12. An apparatus as in claim 11, wherein said contact means further comprises:
    lead straightening means having plural depressions wipingly engageable with said leads for straightening said leads during wiping engagement with said leads.

13. A method of testing the functioning of electronic components having leads, some of which may be bent and straightening said bent leads, prior to insertion of said components into a printed circuit board by an inserter, comprising the steps of:

guiding said components to a test position in a test assembly having lead engageable electrical contacts;

providing selected electronic logic combinations from a controller adapted to simulate operating modes of different selected components;

engaging said contacts with said leads, upon command, and applying said selected logic combination to said contacts during said engagement to effect said testing;

providing said controller with a characteristic number indicative of a good component;

sensing a resultant output of said component by said controller;

comparing said resultant output and said characteristic number to determine good and bad test results;

forming said leads during said testing for insertion into said printed circuit board; and straightening said bent leads during said testing.

14. A method as in claim 13, wherein said method further comprises the steps of:

retesting said component by applying said logic combination in a reversed mode to determine whether said component is functional in a different orientation; and providing for reorientation of said component prior to insertion when it is determined to be functional by reorientation.

15. A method as in claim 14, wherein said method further comprises the step of:

discarding components that are determined bad and transferring components that are determined good after said retest.

16. A method as in claim 13, wherein said method further comprises the step of:

tallying separately said good and bad test results.

17. A method as in claim 14, wherein said method further comprises the step of:

tallying separately good and bad retest results.

18. A method of testing the functioning of electronic components, prior to insertion of said components into a printed circuit board by an inserter, and inserting said components into said printed circuit board comprising the steps of:

guiding said components to a test position in a test assembly having lead engageable electrical contacts;

providing selected electronic logic combinations from a controller adapted to simulate operating modes of different selected components; and engaging said contacts with said leads, upon command, and applying said selected logic combination to said contacts during said engagement to effect said functioning testing;

providing said controller with a characteristic number indicative of a good component;

sensing a resultant output of said component by said controller; and comparing said resultant output and said characteristic number to determine good and bad functioning test results; inserting components having a good functioning test result into positions on said printed circuit board;

skipping any position on said printed circuit board at which a component having a bad functioning test result would have been inserted; and subsequently inserting a component having a good functioning test result into said any position previously skipped.

* * * * *